Jan. 16, 1962 R. F. EATON 3,017,504

CABINET STRUCTURE FOR SMALL RADIO RECEIVERS AND THE LIKE

Filed March 31, 1960 3 Sheets-Sheet 1

INVENTOR.
ROBERT F. EATON
BY Eugene M. Whitacre
ATTORNEY

Jan. 16, 1962 R. F. EATON 3,017,504

CABINET STRUCTURE FOR SMALL RADIO RECEIVERS AND THE LIKE

Filed March 31, 1960 3 Sheets-Sheet 2

INVENTOR.
ROBERT F. EATON
BY Eugene M. Whitacre
ATTORNEY

Jan. 16, 1962 R. F. EATON 3,017,504

CABINET STRUCTURE FOR SMALL RADIO RECEIVERS AND THE LIKE

Filed March 31, 1960 3 Sheets-Sheet 3

INVENTOR.
ROBERT F. EATON
BY Eugene M. Whitacre
ATTORNEY 3,017,504

CABINET STRUCTURE FOR SMALL RADIO RECEIVERS AND THE LIKE

Robert F. Eaton, Stratford, N.J., assignor to Radio Corporation of America, a corporation of Delaware Filed Mar. 31, 1960, Ser. No. 19,102
10 Claims. (Cl. 250—16)

The present invention relates to small radio receivers and the like, and more particularly to cabinet structures and internal apparatus mounting means for radio receivers of this type.

Modern small radio receivers are generally provided with molded plastic cabinets or casings which admit of many ornamental and functional shapes and sections. Such molded plastic cabinets are provided with a front wall or panel having tuning control and other shaft openings therein. At least one of said openings, such as that for the tuning control shaft, may have a circular bezel or flange element integral with the front wall or panel providing an external circular area for the tuning dial or knob with which the latter should be positioned to rotate exactly concentrically. Such an area is provided generally as an ornamental feature of the panel front and may be embossed, recessed, or otherwise defined as above. For this reason the associated internal apparatus and the control shafts therefor, on which the control knobs or dials are mounted, should be centered accurately with such panel openings.

It is therefore, a primary object of the present invention to provide an improved cabinet structure for small radio receivers and the like, with means for mounting internal apparatus, such as a tuning capacitor or the like, with the control shaft thereof axially in alignment with the opening in the receiver panel or front wall to hold a tuning knob, dial or the like, on such shaft in concentric alignment with a circular, ornamental or other, panel element surrounding the shaft opening and associated with the knob or dial.

It is also another object of this invention to provide an improved molded cabinet structure and mounting means for a variable tuning capacitor or the like in radio receivers of the small portable type, which is of simplified and low-cost construction and which assures alignment of the tuning control knob or dial in proper concentric relation with an associated circular ornamental or functional feature of the panel front of the receiver casing.

More specifically, it is an object of this invention to provide simple and effective means for mounting a variable tuning capacitor or like variable control element of a radio receiver in a cabinet of the molded plastic type, with the control shaft of the said element positioned to receive and hold a circular dial or knob in centered or concentric relation to a recessed, projecting, or otherwise defined molded circular area on the outer face of a wall or panel of the cabinet.

The knob or dial is then concentric with the peripheral boundary element of the area, which may be the circular edge of a recess or of a boss element, or a ring, a circular ridge or a flange element on the panel front, molded integrally therewith, and concentric with the axis of the shaft opening in the panel.

In small radio receivers, particularly of the type having molded plastic cabinets or the like, due to the weight involved as well as the size, the tuning capacitor and certain other components necessarily are not adapted for mounting on the thin printed-circuit boards or chassis generally used in such receivers, although such apparatus may be connected therewith. It is desirable, therefore, to mount the larger or heavier circuit elements or components directly on the cabinet, or other firm supporting means connected therewith, rather than on the printed-circuit board or chassis with which they are used.

It is, therefore, a still further object of this invention to provide an improved cabinet or casing of the molded plastic type, for small radio receivers and the like, having internal rigid mounting means for heavier apparatus components, such as tuning capacitors for example, which at the same time serves as a mounting means for printed-circuit boards or chassis used with the said apparatus components, without applying undue stress or loading on such printed-circuit boards or chassis.

It is likewise an object of this invention to provide a simple and effective mounting means for the variable tuning capacitor, or the like, of a radio receiver as above, which may serve as means for mounting a printed-circuit chassis or board to the cabinet front wall, without using mounting ribs or pedestals.

This cabinet construction and mounting means, in accordance with the invention, provides for a much simplified printed-circuit chassis or board attachment to the cabinet since it is effected wholly throughout the variable capacitor mounting means. This, in turn, may be a simple bracket or frame having a circular or cylindrical centering and spacer element integral therewith which may be brought into plug-and-socket engagement with a corresponding or complementary circular or cylindrical centering and spacer element integral with the panel or casing wall.

With this construction, a variable tuning knob or dial may be accurately centered in a recessed ornamental area on the panel front of a receiver without costly lineup procedures and adjustments. In other words, a variable capacitor may be located in a cabinet with minimum error, both linear and angular, for the control shaft center line with respect to the corresponding center line of the cabinet panel opening and the associated outside area with which it is used.

The invention will however be further understood from the following description of certain embodiments thereof, when considered in connection with the accompanying drawings, and its scope is pointed out in the appended claims.

Figure 1:
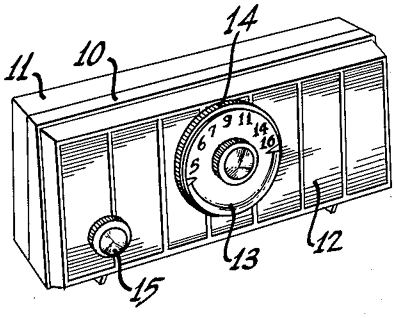
FIGURE 1 is a view in perspective of a small radio receiver having a molded plastic cabinet structure adapted to be arranged in accordance with the invention.

Referring to FIGURE 1, a small radio receiver having a molded plastic casing is shown, which casing comprises a main frontal portion 10 and a rear detachable cover portion 11 which are joined, as shown, to provide a closed casing structure for the receiver. The main frontal portion 10 is provided with a front wall or panel 12 in the center of which is located a rotatable tuning control dial 13 surrounded by a fixed circular ornamental bezel or flange 14 which defines the dial area. A volume control knob 15 is shown on the front panel, and, like the tuning dial 13, is connected by rotatable shaft means (not shown) with interior receiver apparatus.

The front panel or wall 12 is ribbed, as shown, to provide a further ornamental feature. The dial 13 and the bezel or flange 14 must be exactly concentric and have uniform clearance to preserve the ornamental effect and to operate properly. The manner in which this is accomplished, in accordance with the invention, may be described with reference to FIGURES 2, 3 and 4 along with FIGURE 1.

The tuning dial 13, which is of the enlarged circular direct-drive type, is mounted on the end of a rotatable control shaft 18 for the receiver tuning control means, such as a variable tuning capacitor 19, within the casing. The control shaft 18 is aligned with the axis of an opening 20 which is provided for it in the front panel or wall 12 to receive and hold the dial 13 in centered or concentric relation to the bezel or flange 14. The bezel or flange 14 may be integral with the panel front and define the circular area about the dial 13, which area may be effectively recessed as shown or may be projecting, or otherwise defined as may be desired. In any case the problem is to provide a construction by which the dial may be made to stand and to rotate at all times in exact concentric relation to the peripheral boundary of an ornamental circular dial area of the type as defined in the present example by the bezel or flange 14. With this improved construction, when the receiver is assembled in the cabinet, the knob or dial is automatically made concentric with this dial area.

Figure 3:
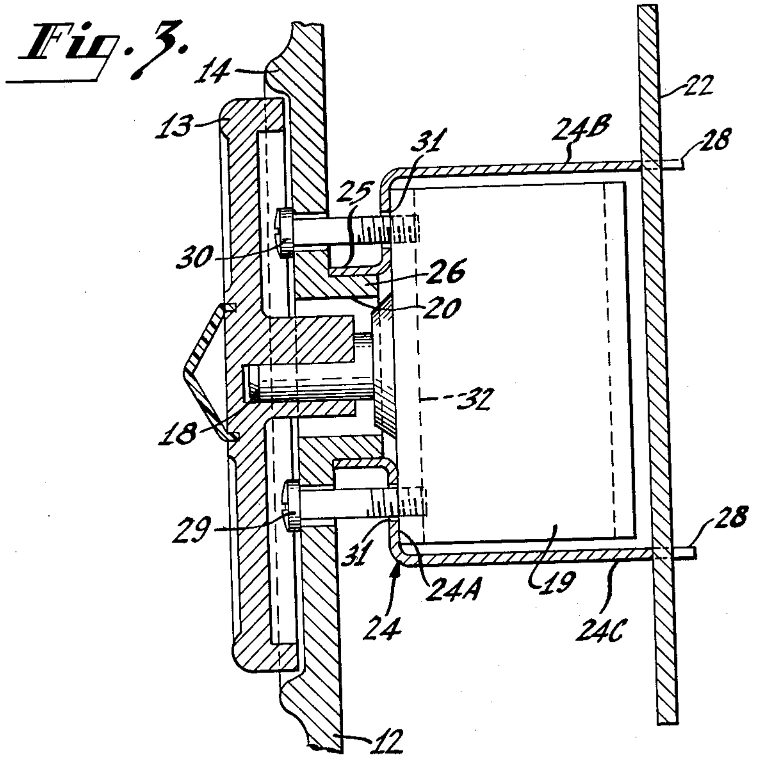
FIGURE 3 is a view in cross section, of the cabinet structure and apparatus mounting arrangement of FIGURE 2, taken on the section line 3—3.
Figure 4:
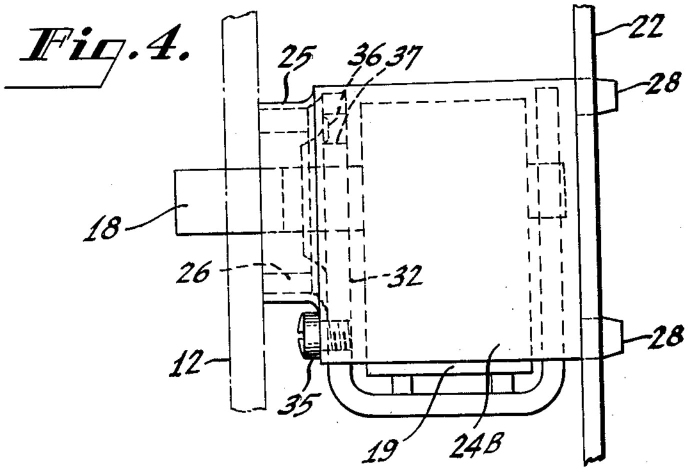
FIGURE 4 is a top view of a portion of the apparatus shown in FIGURES 2 and 3, to further illustrate certain constructional features in accordance with the invention.

Associated with the tuning capacitor 19 within the cabinet or casing, is the receiver chassis 22 which contains the wiring connections and the other apparatus of the receiver. These are not shown specifically in the present example as they do not concern the invention. The chassis 22 may generally be a thin printed-circuit board or chassis element as indicated in FIGURES 3 and 4, and be mounted in spaced relation to the rear face of the panel 12, in association with the tuning capacitor. In accordance with the invention, the printed-circuit board or chassis attachment to the cabinet or casing is wholly through the variable capacitor mounting means. This means may be a bracket or frame 24 having a cylindrical or circular, flange-like spacing and centering element 25 integral therewith and adapted to engage or connect with a corresponding or complementary circular spacing and centering element 26 carried by or integral with the cabinet front wall or panel on the inner face thereof and surrounding the shaft opening 20. Means are provided for holding the bracket or frame 24 and the cabinet together, with the elements 25 and 26 in engagement or connected.

In the present embodiment of the invention, the spacing and centering element 26 is circular or cylindrical and is formed integral with the cabinet wall. It is made concentric with the axis of the shaft opening and with the outer circular area for the dial as defined by the flange or bezel 14. The mounting bracket or frame 24 for the tuning capacitor or other like apparatus element of the receiver, may be a U-shaped element, as shown, provided with the locating or spacing and centering element 25 in the form of a cylindrical flange which is concentric with the axis of the shaft 18 and the opening 20 in the panel or casing wall. This flange, or its equivalent as hereinafter described, may be formed in or secured to the bridge or connecting portion **24*a* between the two substantially parallel, rearwardly-extending, support elements or leg portions 24*b* and 24*c* of the U-shaped bracket or frame 24. The rear or outer ends of the leg portions or support elements are provided with tines 28 or other suitable holding means for mounting the printed circuit board or chassis 22 of the receiver thereon, whereby it is secured and held in spaced relation to and substantially parallel with the inner face of the casing wall or panel 12**.

The tuning capacitor 19, or other variable control element for example, is arranged to be mounted in and secured to the bracket element or frame 24, and the assembly is then held in the cabinet by a single pair of diametrically-spaced bolts 29 and 30 which pass through the panel or front wall into either the bracket or capacitor frame. In the present example these pass through openings 31 in the bracket and into the capacitor frame as indicated at 32. The locating flange 25 on the bracket 24 connects with the locating cylindrical element 26 on the inner face of the casing wall, which is likewise a flange element, in a plug-and-socket construction, and holds the shaft axis in exact alignment with the axis of the shaft opening and the circular area for the dial.

Figure 2:
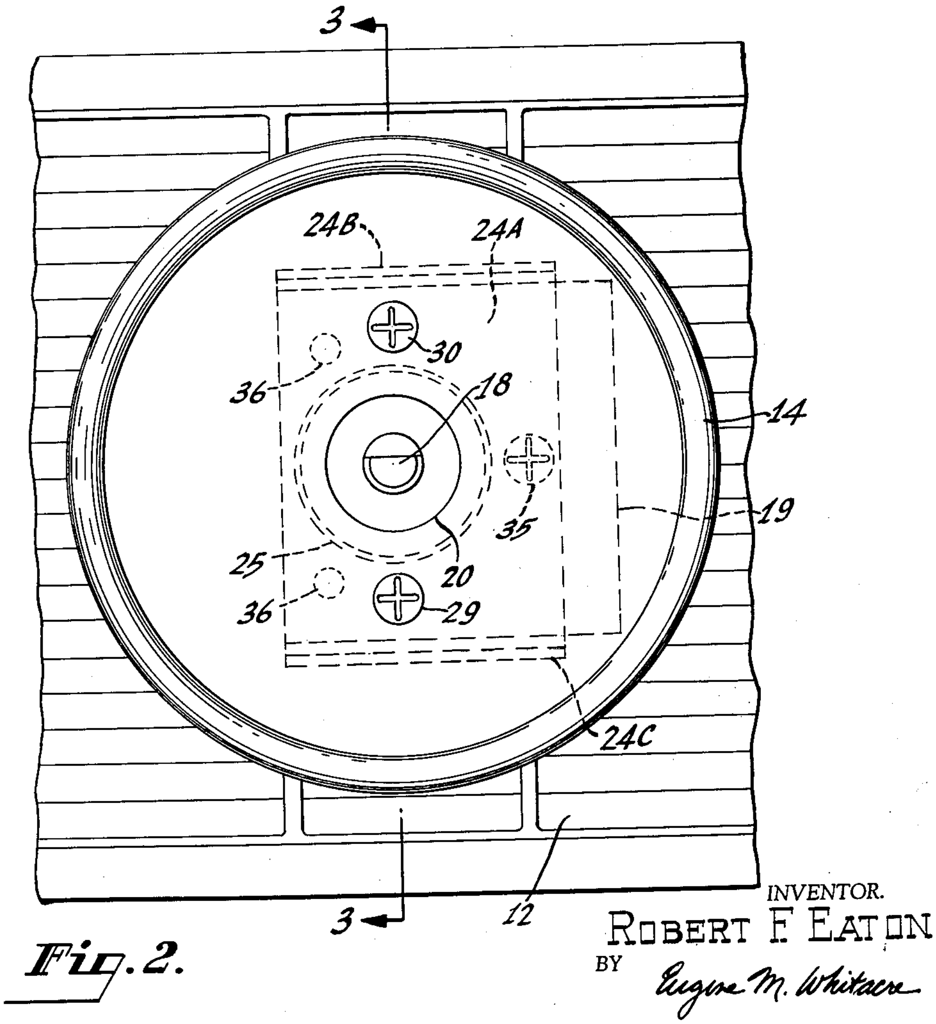
FIGURE 2 is an enlarged fragmentary front view of the cabinet of FIGURE 1 showing details of construction thereof, and apparatus mounting therein, in accordance with the invention.

The bracket 24 and the capacitor 19 are located exactly for holding the shaft concentric with the spacing and centering element 25, and locked together, by a bolt 35 which passes through the bracket and into the frame 32 of the capacitor. In addition, two spaced extruded buttons or projections 36, on the frame 24, engage with corresponding exactly positioned locating holes 37 in the capacitor frame 32, all as shown in FIGURES 2 and 4.

There is thus provided in the cabinet structure and mounting means, a bracket locating, or centering and spacing, cylindrical or circular flange element 26 integral with the panel or front wall of the cabinet and surrounding and concentric with the shaft opening in the wall. On the bracket 24, a similar and complementary locating, or centering and spacing, cylindrical or circular flange element 25, or the like, is provided in the plug-and-socket construction referred to, to engage and interconnect with the cabinet flange element 26.

The mounting means may thus be considered to comprise effectively two mating circular or cylindrical plug-and-socket elements coaxial with the control shaft of the device to be mounted, which engage or connect with one another in effectively a plug-in construction. The control shaft is then aligned with the axis of the shaft opening in the panel wall and with the external circular area for the dial or knob. Thus the dial, in the present example, is held to rotate in concentric or centered relation to the dial area which, in the present example, is defined by the bezel or raised rim 14 of the area. In other cases it will be seen that the circular periphery of the dial area may be defined by other means depending upon whether the area is depressed, raised, or substantially level with the panel front surface.

Furthermore, in addition to providing a mounting means for the variable tuning capacitor or the like, as above described, the mounting means provides also for mounting the printed-circuit chassis or board for the receiver in fixed, and generally parallel, relation to the cabinet front or panel, without using mounted ribs or pedestals, which are known for the purpose, and which involve molding problems and higher costs.

It will noted that the cylindrical flange element 25 fits over, or outside of, the rearwardly extending flange element 26 on the panel front as shown more clearly in FIGURE 3. In the modification shown in FIGURE 5, to which attention is now directed along with FIGURE 3, it will be seen that the frame 24 may be provided with a short cylindrical flange element 40 which fits inside a rearwardly projecting flange element 41 on the front wall 42 of the receiver casing, similar to that shown in FIGURES 1–4. It will be noted that the flange element 41 is counterbored to provide a shoulder or bottom 43 against which the flange 40 may seat when the frame 24, the capacitor 19 and the panel 42 are drawn together by the mounting bolts 29 and 30. The latter are recessed into openings 44 in the panel, in the present example.

Figure 7:
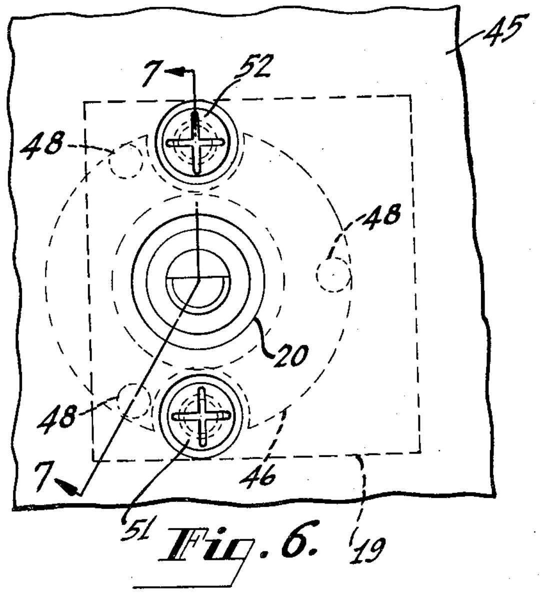
FIGURE 7 is a cross-sectional view of the modification shown in FIGURE 6, taken on the section line 7—7 of FIGURE 6.
Figure 6:
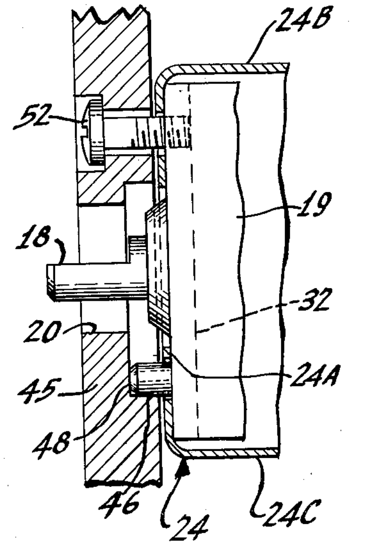
FIGURE 6 is a fragmentary front view of a radio receiver cabinet front panel as a further modification of the invention.

Referring now to FIGURES 6 and 7, and the further modification shown therein relating particularly to the manner in which the frame 24 is mounted, it will be seen that the front wall or panel 45 of the receiver casing is made sufficiently thick so that it may be recessed or counterbored on the inner face as shown at 46 to provide a circular locating element without any rearward projection.

This circular counterbore or recess is adapted to receive three angularly-spaced pins 48 located in a circle and contacting the outer periphery or wall thereof. The pins 48 may be secured to and carried by the bracket or frame 24 for the capacitor 19, or by the capacitor frame as indicated, and thus provide effectively the same flange-like centering and spacing means as in the preceding embodiments. In the present case the pins provide effectively three spaced elements of a flange, which are set in a circle of like size, about and concentric with the shaft axis or opening in the panel or casing wall. This flange or circle of elements is formed on or secured to the bridge element 24*a* between the two leg elements 24*b* and 24*c* of the frame 24.

Figure 5:
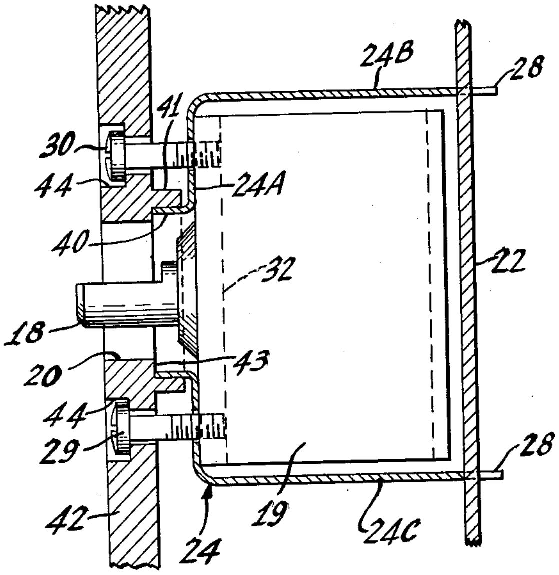
FIGURE 5 is a view in cross section, similar to that of FIGURE 3, of a cabinet structure and apparatus mounting means as a modification of the invention.

Like the preceding embodiments, the present construction comprises the U-shaped mounting frame 24 secured in fixed relation to the variable control element or capacitor 19 and having forwardly extending spacing and centering means, which are the pins 48, concentric with the axis of the control shaft 18 and in mating engagement with the locating element, which is the counterbore 46, on the inner face of the wall 45, to hold the shaft 18 centered in the dial area. In FIGURES 5, 6 and 7, only a fragmentary portion of the front wall or panel is shown and the dial or control knob has been omitted, for the sake of simplifying the drawing, and in FIGURES 6 and 7 the showing of the printed circuit board or chassis has been omitted. The variable tuning control device 19 is held in place, along with the frame 24, by two diametrically opposed bolts 51 and 52, similar to the bolts 29 and 30 in the preceding embodiments. The construction and operation is otherwise the same as shown and described for FIGURES 1–4.

In any case, the knob or dial is arranged to operate in concentric relation with the peripheral boundary element of the front area which may be the circular edge of a recess or a boss element, or a ring, a circular ridge or a flange element on the panel front and concentric with the axis of the shaft opening in the panel.

From the foregoing description it will be seen that an improved radio receiver cabinet or casing of the molded plastic type for small radio receivers or the like may be provided with internal rigid mounting means for heavier apparatus components, such as tuning capacitors, which also provides mounting means for printed circuit board or like chassis elements used with such apparatus components, without applying undue load or stress to such chassis elements.

What is claimed is:

1. In a radio receiver, the combination of a casing therefor having a wall with a shaft opening therein and means providing a defined circular outer area on said wall about and concentric with said shaft opening, circular apparatus spacing and centering means integral with the inner face of said wall and concentric with said shaft opening, a control device for said receiver having a rotary operating shaft, a circular dial element for said shaft, a mounting frame for said device, and circular spacing and centering means connected with said frame and device concentric with the shaft and complementary to said first named spacing and centering means to provide an interlocked connection therewith for holding said frame and device with the shaft centered with respect to said circular outer area, whereby said dial element may operate on said shaft in concentric relation to said circular outer area.

2. In a radio receiver, the combination of a casing therefor having a wall with a shaft opening therein and means providing a defined circular outer area on said wall about and concentric with said shaft opening, means providing a circular recess in the inner face of said wall about and concentric with said shaft opening, a control device for said receiver having a rotary operating shaft, a circular dial element for said shaft, a mounting frame for said device, and a plurality of spacing and centering pins connected with said frame and device and arranged in a circle concentric with the shaft and of a diameter to seat in said recess and provide contact with the periphery thereof for holding said frame and device with the shaft centered with respect to said circular outer area, whereby said dial element may operate on said shaft in concentric relation to said circular outer area.

3. In a radio receiver, the combination of a molded plastic casing therefor having a front wall with a shaft opening therein and a defined circular dial area on the outer face of said wall in concentric relation to said shaft opening, rearwardly opening circular apparatus spacing and centering means integral with the inner face of said wall and concentric with said shaft opening, a tuning control element for said receiver having a rotary control shaft, a mounting frame secured in fixed relation to said tuning control element and having forwardly-extending spacing and centering means concentric with the shaft, means for holding the casing and said frame together with said spacing and centering means in engagement to hold said shaft centered with respect to said dial area, and a circular control dial mounted on the outer end of said shaft to operate in concentric relation to said circular area.

4. In a radio receiver, the combination of a molded plastic casing therefor having a front wall with a shaft opening therein and an ornamental dial area on the outer face thereof having a circular boundary in concentric relation to the axis of said shaft opening, rearwardly opening circular apparatus spacing and centering means integral with the inner face of said wall and concentric with the axis of said shaft opening, a control element for said receiver having a rotary operating shaft, a mounting frame secured in fixed relation to said control element and having forwardly extending spacing and centering means concentric with the axis of the control shaft and connected with said spacing and centering means on the inner face of said wall to hold said shaft centered with respect to said dial area, means connecting the casing and said frame together with said spacing and centering means in engagement, and a circular dial mounted on the outer end of said shaft to operate in concentric relation to the boundary of said ornamental area.

5. In a radio receiver, the combination of a molded plastic casing therefor having a front wall with an opening therein for a tuning control shaft and an ornamental tuning dial area on the outer face of said wall, said dial area having a circular boundary and integral means defining said boundary in concentric relation to the axis of said shaft opening, a rearwardly extending circular flange element integral with the inner face of said wall and concentric with the axis of said shaft opening, a tuning control device for said receiver having a rotary operating shaft, a mounting frame secured in fixed relation to said tuning control device and having forwardly extending complementary circular flange element concentric with the axis of the control shaft and connected with said first named flange element in interlocking coaxial engagement to hold said shaft centered with respect to said dial area, means connecting the casing and said frame together to hold said flange elements in engagement, and a circular tuning dial mounted on the outer end of said shaft to operate in concentric relation to the boundary of said ornamental area.

6. In a radio receiver, the combination of a molded plastic casing having a front wall with a control shaft opening therein and means defining an ornamental circular area on the outer face of said wall in concentric relation to said opening, means providing a circular apparatus locating elemental integral with the inner face of said wall and concentric with said shaft opening, a variable control device for said receiver having an operating shaft extending through the panel opening axially thereof, a mounting bracket secured in fixed relation to said control device and having apparatus locating means concentric with the control shaft and in complementary mating engagement with said locating element on the inner face of said wall to hold said shaft centered relative to said circular area on the outer face of said wall, said bracket having rearwardly extending support elements, a printed-circuit board for connection with said control element mounted on said support elements in substantially parallel relation to said casing wall, means connecting the casing and said bracket together with said locating element and locating means in engagement, thereby to provide combined mounting means for said control device and the printed-circuit board in connection with said casing wall.

7. In a radio receiver, the combination of a molded plastic casing having a front wall with a control shaft opening therein and means defining an ornamental circular dial area on the outer face of said wall in concentric relation to said opening, means providing a circular apparatus locating element integral with the inner face of said wall and concentric with said shaft opening, a variable tuning capacitor for said receiver having a frame for mounting and supporting the elements thereof and having an operating shaft exteding through the panel opening axially thereof, a mounting bracket secured to said capacitor frame at least at two spaced points and having circular apparatus locating means concentric with the control shaft, said locating means being in complementary mating engagement with said locating element on the inner face of said wall to hold said shaft centered in said dial area, means connecting the casing and said bracket together with said locating element and locating means in engagement, a printed-circuit chassis element for said receiver mounted on said bracket, and a circular tuning dial mounted on the outer end of said shaft to operate in concentric relation to said circular dial area.

8. In a radio receiver, the combination of a molded plastic casing having a front panel with a tuning control shaft opening therein and integral means thereon defining a circular ornamental tuning-dial area in concentric relation to said shaft opening, circular apparatus spacing and centering means integral with the inner face of said panel and concentric with said shaft opening, a tuning control element for said receiver having a rotary operating shaft aligned with the axis of said opening, a U-shaped mounting frame secured in fixed relation to said control element, said frame having rearwardly extending leg portions and circular apparatus spacing and centering means intermediate between said leg portions and in concentric relation to the axis of the control shaft, said last named centering and spacing means being complementary to and connected with said spacing and centering means on the inner face of said panel in a plug-and-socket construction to hold said shaft centered with respect to said tuning-dial area, means connecting the front panel and frame tobether with said spacing and centering element and means in engagement, a printed-circuit chassis board mounted on the leg portions of said frame in spaced relation to said panel within the casing, and a circular tuning dial mounted on the outer end of said shaft to operate in concentric relation to said circular dial area.

9. In a radio receiver, the combination of a molded plastic casing having a wall with a shaft opening therein and means thereon defining a circular ornamental area in concentric relation to said shaft opening, a control element for said receiver having a rotary shaft, an apparatus mounting frame secured to said control element, means integral with the inner face of said wall and means carried by said frame providing complementary circular apparatus spacing and centering means concentric with the axis of the control shaft and connected to hold said shaft aligned with said opening and centered with respect to said circular area, a printed-circuit chassis for said receiver mounted on said frame, and a circular dial element mounted on said shaft to operate in concentric relation to said circular area.

10. In a radio receiver, the combination of a molded plastic casing having a wall with a shaft opening therein and means thereon defining a circular ornamental area in concentric relation to said shaft opening, a control element for said receiver having a rotary shaft, an apparatus mounting frame secured to said control element, means including a circular recess in the inner face of said wall and three angularly-spaced pin elements connected with said frame and seated in said recess in engagement with the outer wall thereof providing a connection between said control element and said casing to hold said shaft aligned with said opening and centered with respect to said circular area, a printed-circuit chassis for said receiver mounted on said frame, and a circular dial element mounted on said shaft to operate in concentric relation to said circular area.

References Cited in the file of this patent

UNITED STATES PATENTS 2,738,419 Harasek -------------- Mar. 13, 1956